(12) United States Patent
Matsunaga et al.

(10) Patent No.: US 6,750,138 B2
(45) Date of Patent: Jun. 15, 2004

(54) SEMICONDUCTOR DEVICE OF MULTI-WIRING STRUCTURE AND METHOD OF MANUFACTURING THE SAME

(75) Inventors: Noriaki Matsunaga, Chigasaki (JP); Yoshiaki Shimooka, Kawasaki (JP); Kazuyuki Higashi, Yokohama (JP); Hideki Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/407,426

(22) Filed: Apr. 7, 2003

(65) Prior Publication Data

US 2003/0201539 A1 Oct. 30, 2003

Related U.S. Application Data

(62) Division of application No. 09/995,602, filed on Nov. 29, 2001, now Pat. No. 6,563,218.

(30) Foreign Application Priority Data

Sep. 27, 2001 (JP) ......................................... 2001-298309

(51) Int. Cl.[7] ......................................... H01L 21/4763
(52) U.S. Cl. ......................................... 438/623; 438/781
(58) Field of Search ................................ 438/623, 624, 438/781, 789, 790

(56) References Cited

U.S. PATENT DOCUMENTS

| 4,795,693 | A | * | 1/1989 | Ors et al. ................. 430/312 |
| 4,903,118 | A | | 2/1990 | Iwade ....................... 257/783 |
| 6,040,628 | A | | 3/2000 | Chiang et al. ............. 257/760 |
| 6,093,577 | A | * | 7/2000 | van der Groen et al. ... 438/457 |
| 6,157,083 | A | | 12/2000 | Usami et al. .............. 257/760 |
| 6,225,238 | B1 | * | 5/2001 | Wu ............................ 438/781 |
| 6,309,956 | B1 | | 10/2001 | Chiang et al. ............. 438/624 |
| 6,376,370 | B1 | * | 4/2002 | Farrar ....................... 438/678 |
| 6,448,653 | B1 | | 9/2002 | Allman et al. ............. 257/758 |

FOREIGN PATENT DOCUMENTS

JP        10-189715        7/1998

* cited by examiner

*Primary Examiner*—Chandra Chaudhari
(74) *Attorney, Agent, or Firm*—Oblon, Spivak, McClelland, Maier & Neustadt, P.C.

(57) ABSTRACT

A plurality of wiring layers are laminated on an LSI chip. Each wiring layer includes an electrode to which is applied a mechanical pressure, a first insulating film formed in a region where it is necessary to have a high mechanical strength and having the electrode formed therein, a second insulating film formed in the same layer as the layer of the first insulating film and formed in a region where a mechanical strength higher than that of the first insulating layer is not required, and a wiring layer formed on the surface of the second insulating film.

8 Claims, 9 Drawing Sheets

FIG. 11B

SEMICONDUCTOR DEVICE OF MULTI-WIRING STRUCTURE AND METHOD OF MANUFACTURING THE SAME

This application is a divisional application under 37 C.F.R. §1.53(b) of parent applicaction Ser. No. 09/995,602, filed on Nov. 29. 2001, now U.S. Pat. No. 6,563,218 and includes non-elected Claims 13–20 of the parent application.

CROSS-REFERENCE TO RELATED APPLICATIONS

This application is based upon and claims the benefit of priority from the prior Japanese Patent Application No. 2001-298309, filed Sep. 27, 2001, the entire contents of which are incorporated herein by reference.

BACKGROUND OF THE INVENTION

1. Field of the Invention

The present invention relates to a semiconductor device of a multi-wiring structure, particularly, to the structure of an insulating film within the same wiring layer.

2. Description of the Related Art

In order to improve the performance of a semiconductor device, particularly, an LSI, the dielectric constant of the insulating film used in the multi-wiring structure is being made lower and lower. To be more specific, by lowering the dielectric constant of the insulating film formed between adjacent wiring layers, the parasitic capacitance between the adjacent wiring layers is lowered, and the delay time of the signal propagated through the wiring is improved so as to improve the operation speed of the LSI.

In order to lower the dielectric constant k of the insulating film to 3 or less, it is necessary to lower the density of the insulating film. However, because of the trade off relationship with the mechanical strength of the insulating film, the mechanical strength of the insulating film is rendered insufficient with decrease in the dielectric constant of the insulating film.

In the semiconductor device of the conventional multi-wiring structure, the insulating film used in the same wiring layer is formed of a single material. If the insulating film is formed of a material having a low dielectric constant, problems are generated as follows.

First of all, in the case of using an insulating film having a low dielectric constant in the multi-wiring structure, the insulating film is incapable of withstanding the mechanical impact in, for example, the bonding step and the packaging step, leading to breakage of the insulating film.

Figure 1:
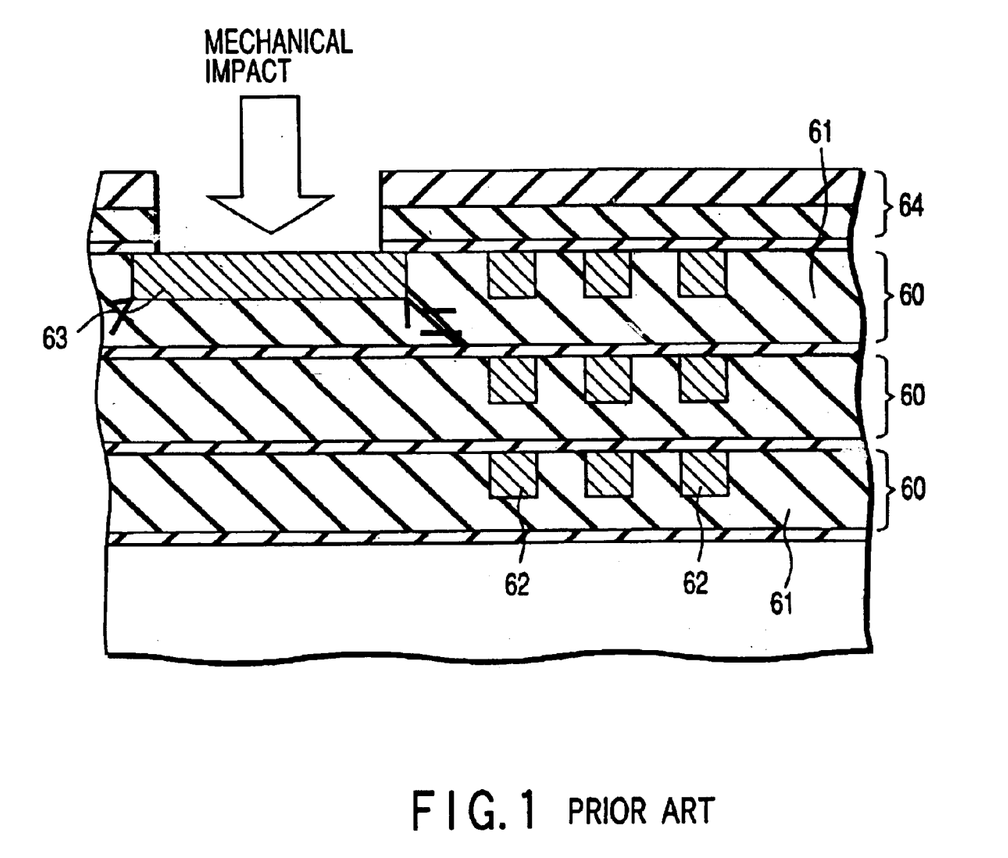
FIG. 1 is a cross sectional view showing a conventional semiconductor device.

For example, FIG. 1 shows the case where the insulating film is broken by the mechanical impact in the bonding step. In FIG. 1, each of a plurality of wiring layers 60 is formed by using an insulating film 61 having a low dielectric constant and a low density. Each of a plurality of metal wirings 62 is formed of, for example, a Cu layer buried in the surface region of each of the insulating films 61. Also, a bonding pad 63 formed of Cu is formed in the uppermost wiring layer 60 together with the metal wirings 62. Further, a passivation film 64 is formed on the uppermost wiring layer 60.

It should be noted that, if the insulating film 61 is formed of a material having a low dielectric constant and a low density, the insulating film 61 is broken in the corner portion below the bonding pad 63 by the mechanical impact in the bonding step of the bonding pad 63.

A second problem is that the semiconductor device is adversely affected by the gas or water generated from the insulating film in the process of forming the insulating film. Where the insulating film is formed by the coating of methyl polysiloxane, followed by baking the coated film, the coated film of methyl polysiloxane is crosslinked by the dehydration condensation reaction, with the result that a large amount of hydrogen and water are released in the process of forming the insulating film. It should be noted in this connection that, if a ferroelectric memory cell or a MIM (metal-insulator-metal) capacitor is formed in the LSI, the capacitor insulating films of these elements incur deterioration of the performance if heated under a hydrogen atmosphere.

Figure 2A:
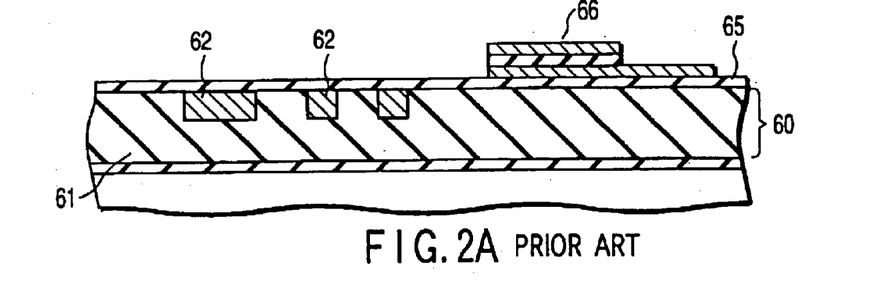
FIGS. 2A to 2C are cross sectional views successively showing the conventional steps of manufacturing a semiconductor device.
Figure 2B:
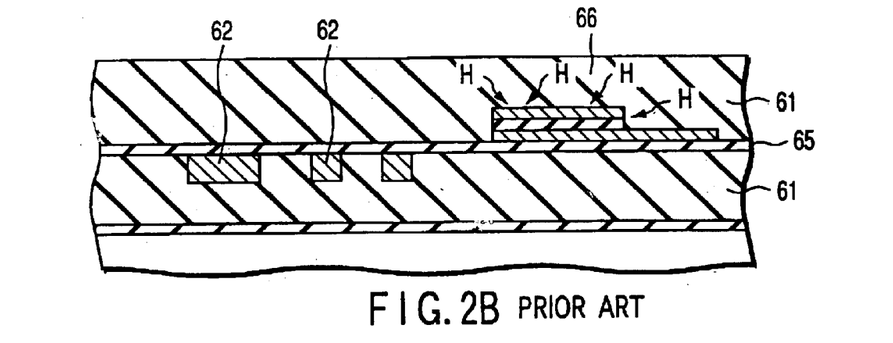
Figure 2C:
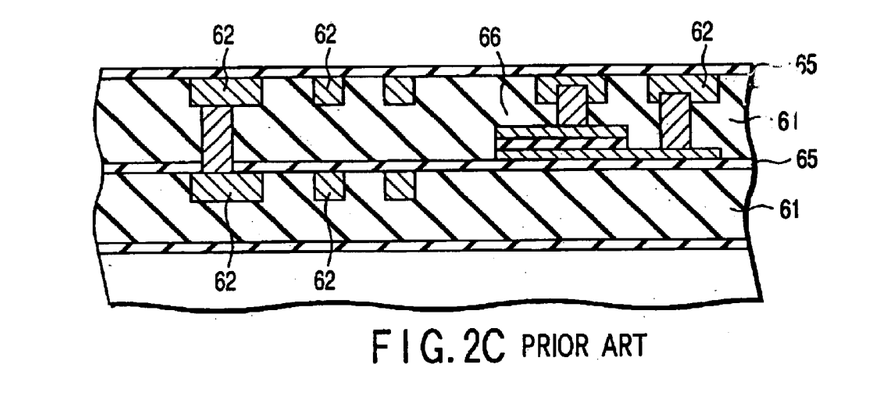

FIGS. 2A to 2C are cross sectional views collectively showing the manufacturing process of a semiconductor device in which an MIM capacitor is formed in a single wiring layer forming a multi-wiring structure.

In the first step, formed is a wiring layer 60 in which a metal wiring 62 made of, for example, Cu is buried in a surface region of an insulating film 61 made of, for example, SOG (spin on glass), as shown in FIG. 2A. Then, a stopper insulating film 65 made of, for example, silicon nitride (SiN) is formed on the entire surface, followed by forming an MIM capacitor 66 on the stopper insulating film 65. The MIM capacitor 66 includes an upper electrode, a lower electrode, and a capacitor insulating film interposed between the upper electrode and the lower electrode and made of, for example, silicon nitride, tantalum oxide or titanium nitride.

In the next step, the entire surface is coated with, for example, methyl polysiloxane, followed by baking the coated film so as to form an insulating film 61 constituting the upper wiring layer, as shown in FIG. 2B. When the insulating film 61 is baked, a large amount of hydrogen (H) is released from the coated film of methyl polysiloxane. If the released hydrogen is heated, hydrogen is taken into the capacitor insulating film of the MIM capacitor 66 so as to deteriorate the performance.

Further, a metal wiring 62 made of, for example, Cu is formed in a manner to extend through the surface and the inner region of the insulating film 61, as shown in FIG. 2C.

Further, a third problem to be noted is that corrosion, erosion and peeling of another film is caused by the gas released from the insulating film. There is an insulating film having a high susceptibility to water and a high water permeability. Also, when it comes to an insulating film having a bond relatively low in its bonding energy, there is an unstable film that releases a gas under the temperature of about 350 to 400° C. in the step of forming a multi-wiring structure. Need less to say, the characteristics of the insulating film itself that releases the gas are changed. In addition, the corrosion, erosion, and peeling of another insulating film are brought about by the released gas.

Figure 3:
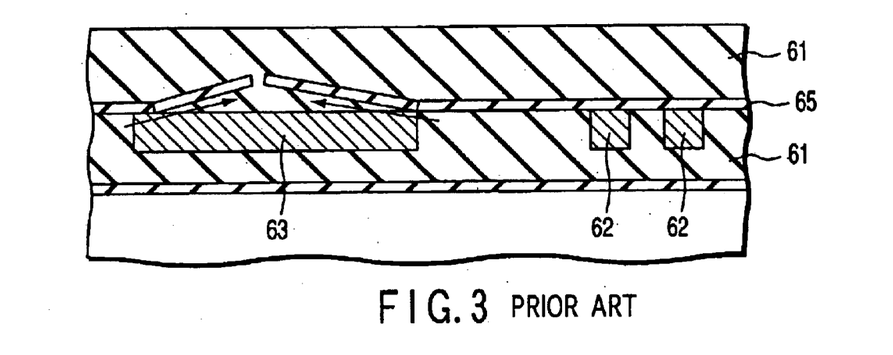
FIG. 3 is a cross sectional view showing a conventional semiconductor device.

FIG. 3 shows the peeling of a film in the heating step in the case of using a film that is likely to release a gas as the insulating film 61 constituting a wiring layer. In FIG. 3, the stopper film 65 made of, for example, silicon nitride (SiN) is formed on the insulating film 61 constituting the wiring layer, followed by forming a new insulating film 61 on the stopper insulating film 65. If the new insulating film 61 is formed of a film that is likely to release a gas in the heating step for baking the insulating film 61, a gas is released from the insulating film 61. The released gas causes the peeling of the stopper film 65 in the portion where the bonding strength of the stopper film 65 with the underlying film is low, e.g., on the bonding pad 63.

As described above, it was customary in the past to use a single material for forming an insulating film included in the same wiring layer. Therefore, if it is intended to increase the operating speed by using an insulating film having a low dielectric constant, serious problems are generated in respect of the reliability that the insulating film is broken by a mechanical impact, that the element is adversely affected by the gas or water released from the insulating film, and that the corrosion, erosion, and the peeling of the film are brought about by the gas released from the insulating film.

BRIEF SUMMARY OF THE INVENTION

According to an aspect of the present invention, there is provided a semiconductor device of a multi-wiring structure, comprises an electrode to which is applied a mechanical pressure; a first insulating film formed in a region where it is necessary to have a high mechanical strength and having the electrode formed therein; a second insulating film formed in the same layer as the layer of the first insulating film and formed in a region where a mechanical strength higher than that of the first insulating layer is not required; and a wiring layer formed on the surface of the second insulating film.

According to another aspect of the present invention, there is provided a method of manufacturing a semiconductor device having a multi-wiring structure, comprises coating a substrate with a film of an insulating material in which a crosslinking reaction or a foaming reaction is generated; subjecting the film of the insulating material to a heat treatment so as to bring about a crosslinking reaction or a foaming reaction, thereby forming a first insulating film on the substrate; selectively removing the first insulating film such that the first insulating film is selectively left unremoved on the substrate and is removed in the other region; and forming a second insulating film in the region where the first insulating film has been removed.

DETAILED DESCRIPTION OF THE INVENTION

Some embodiments of the present invention will now be described in detail with reference to the accompanying drawings.

Figure 4A:
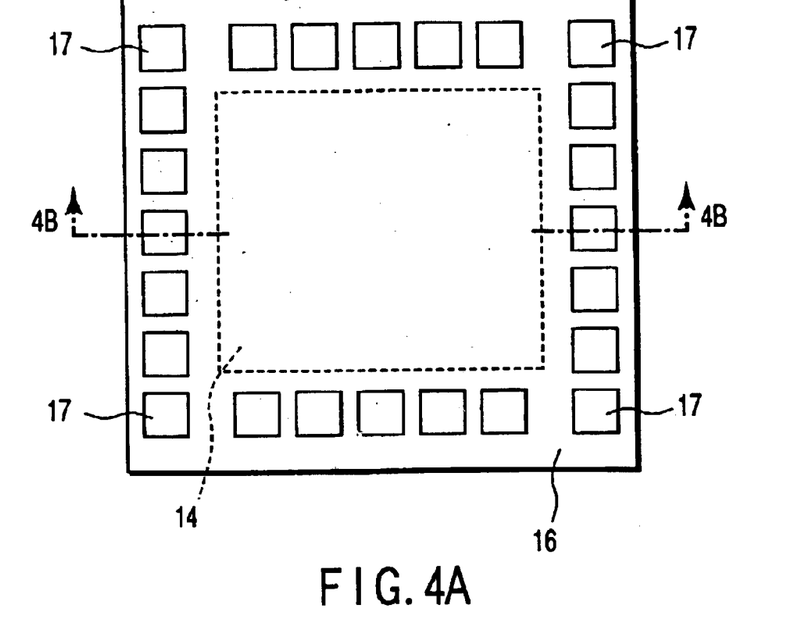
FIG. 4A is a plan view showing an LSI chip according to a first embodiment of the present invention.
Figure 4B:
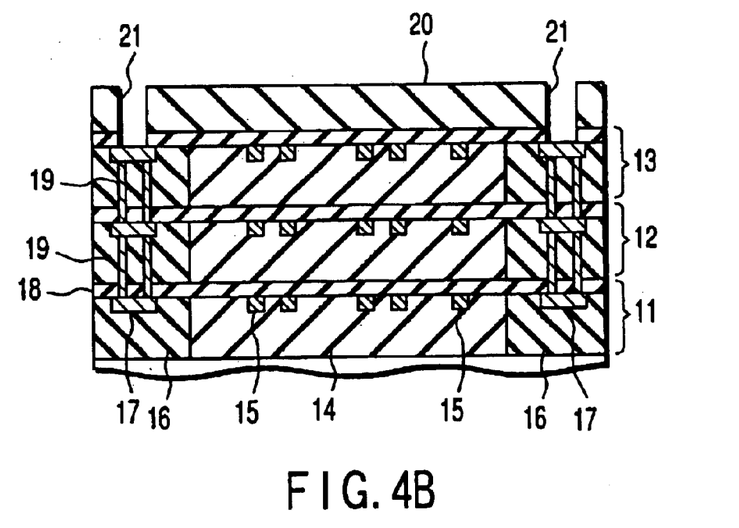
FIG. 4B is a cross sectional view along the line 4B—4B shown in FIG. 4A.

FIGS. 4A and 4B are a plan view and a cross sectional view, respectively, collectively showing an LSI chip according to a first embodiment of the present invention, in which the technical idea of the present invention is applied to an LSI. Incidentally, the construction in only the upper region of the LSI chip is shown in FIG. 4B. Also, the actual size is not necessarily reflected in the drawings.

As shown in the drawings, three wiring layers 11, 12 and 13 are laminated one upon the other in an upper portion of the chip. In each of these three wiring layers 11, 12 and 13, two kinds of insulating films, i.e., an insulating film 14 and another insulating film 16, are formed in the central portion and the peripheral portion of the chip, respectively.

The insulating film 14 formed in the central portion of the chip is formed of, for example, an organic SOD (spin on dielectric) film. The insulating film 14 has a large number of pores and has a dielectric constant k lower than 3. For example, the dielectric constant k of the insulating film 14 is set to fall within a range of between 2.2 and 2.7. Also, a plurality of metal wirings 15 made of, for example, Cu are buried in a surface region of the insulating film 14.

The other insulating film 16 formed in the peripheral portion of the chip is made of a SiN film formed by, for example, a plasma CVD method. The insulating film 16, which has a dielectric constant k higher than that of the insulating film 14 formed of an organic SOD film, is excellent in the mechanical strength. A plurality of bonding pads 17 made of, for example, Cu are buried in a surface region of the insulating film 16.

A stopper film 18 made of at least one material selected from the group consisting of SiN, SiCN and SiCO is formed in an upper portion of each of the wiring layers 11, 12 and 13. The stopper film 18 serves to prevent Cu from being diffused into another wiring layer.

It should be noted that the bonding pads 17 formed in the wiring layers 11, 12 and 13 are electrically connected to each other through via wires 19 formed in the wiring layers 12 and 13.

A passivation film 20 of a three layer structure of, for example, SiN film/TEOS-SiO$_2$ film/SiN film is formed on the uppermost wiring layer 13. An opening 21 for the bonding is formed in that portion of the passivation film 20 which corresponds to the bonding pad 17.

In the LSI chip shown in FIGS. 4A and 4B, each of the plural wiring layers 11, 12 and 13 includes an insulating film having the metal wirings 15 and the bonding pad 17 formed in the surface region. Also, each insulating film includes the insulating film 14 formed in the central portion of the chip and the other insulating film 16 formed in the peripheral portion of the chip.

The insulating film 14 included in each of the wiring layers 11, 12, 13 and having the metal wirings 15 formed in the surface region has a large number of pores and has a small value of the dielectric constant k falling within a range of between 2.2 and 2.7. Therefore, the degree of the capacitance coupling between the metal wirings 15 formed in the adjacent metal wiring layers is diminished so as to make it possible to suppress the value of the parasitic capacitance accompanying each of the metal wirings 15 to a small value. As a result, the delay time of the signal propagated through each of the metal wirings 15 is improved so as to increase the operating speed of the LSI chip.

On the other hand, the insulating film 16 positioned around or below the bonding pad 17 in each of the wiring layers 11, 12 and 13 is made of a SiN film formed by a plasma CVD method. The insulating film 16 is superior to the insulating film 14 made of an organic SOD film in the mechanical strength. Therefore, even where a mechanical impact (mechanical pressure) is applied to the bonding pad 17 in the bonding step for bonding a wire to the bonding pad 17 included in the uppermost wiring layer 13 or in the packaging step, the insulating film 16 is unlikely to be broken.

Further, the insulating film 16 consisting of a SiN film formed by a plasma CVD method is low in the water adsorption and in the water permeability so as to make it possible to suppress the peeling of the stopper film 18 in the vicinity of the bonding pad 17, in which the peeling of the film tends to be caused relatively easily by the gas released from the insulating film.

As described above, the LSI chip according to the first embodiment of the present invention permits achieving a high operating speed without impairing the reliability.

In the first embodiment of the present invention described above, the insulating film constituting each of the wiring layer is formed of two different kinds of insulating films. However, it is also possible for the insulating film constituting each wiring layer to be formed of three or more different kinds of insulating films.

Also, in the first embodiment described above, an organic SOD film is used for forming the insulating film 14 having a dielectric constant not larger than 3. However, some of the SiN films formed by a plasma CVD method have a dielectric constant not larger than 3. It is also possible to use such a SiN film having a dielectric constant not larger than 3 for forming the insulating film 14.

The LSI chip shown in FIGS. 4A and 4B can be manufactured by the manufacturing process described in the following with reference to FIGS. 5A to 5G.

Figure 5A:
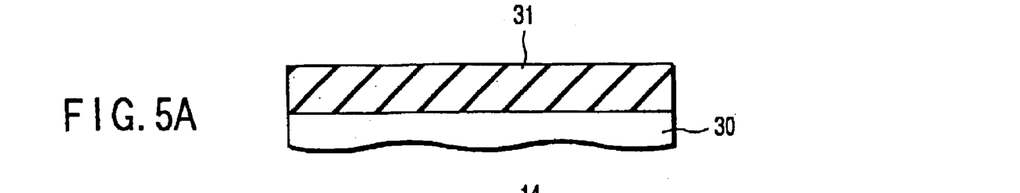
FIGS. 5A to 5G are cross sectional views successively showing the manufacturing steps of an LSI chip according to the first embodiment of the present invention.

In the first step, an organic SOD (spin on dielectric) film 31 is formed on a wafer (substrate) 30 having elements and other wiring layers formed therein in advance by coating the surface of the wafer 30 with a coating material prepared by mixing an insulating film precursor including $SiO_2$ having an OH group attached thereto as a basic skeletal structure and a solvent, as shown in FIG. 5A. A spin coating method is employed for the coating.

Figure 5B:
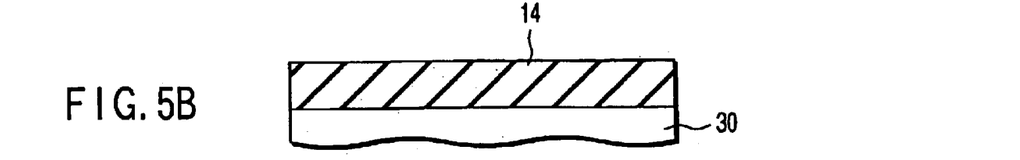

In the next step, a heat treatment is applied to the organic SOD film 31 under an oxygen gas atmosphere or a nitrogen gas atmosphere under temperatures of, for example, 350 to 400° C. so as to convert the organic SOD film 31 into an insulating film 14, as shown in FIG. 5B. In this step, a dehydration polymerization takes place between the insulating film precursors so as to form crosslinkage of $SiO_2$ with an oxygen atom interposed therebetween. As a result, a large number of pores are formed in the insulating film 14 so as to render the insulating film 14 porous.

In general, the dehydration polymerization is brought about under temperatures not lower than 350 to 400° C., and evaporation of the solvent is started at about 200° C. Also, the dielectric constant k of the porous insulating film 14 falls within a range of between 2.2 and 2.7.

Figure 5C:
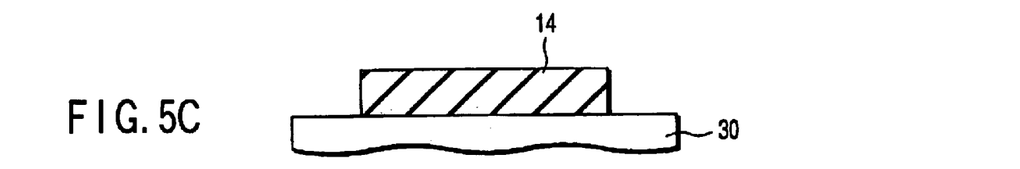
Figure 5D:
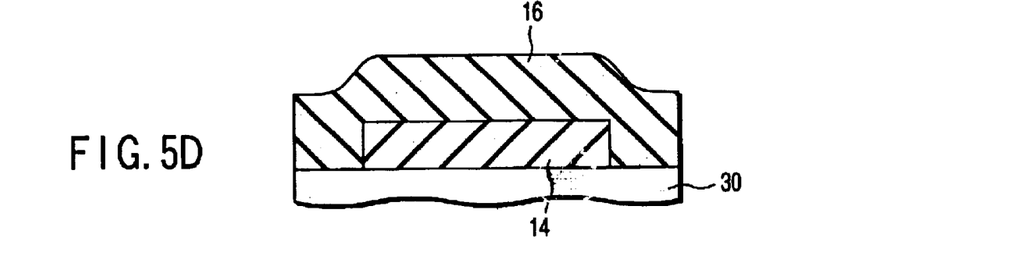

In the next step, the insulating film 14 is selectively etched by a PEP process so as to leave the insulating film 14 unremoved in the central portion alone of each chip and to remove the other portion, as shown in FIG. 5C, followed by depositing an insulating film 16 made of SiN on the entire surface by, for example, a plasma CVD method, as shown in FIG. 5D.

Figure 5E:
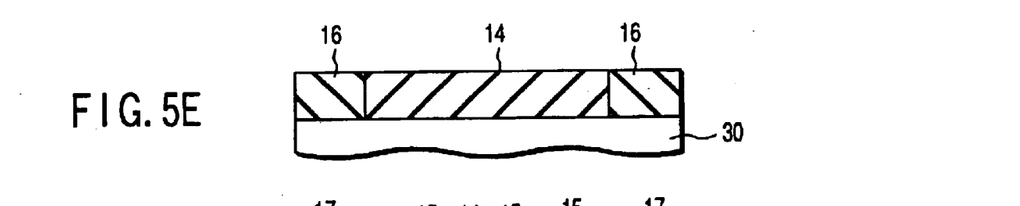

Further, the upper portion of the insulating film 16 is removed by the polishing with a CMP method or by an etch back method after deposition of a resist until the upper surface of the insulating film 16 is rendered flush with the upper surface of the insulating film 14, as shown in FIG. 5E. As a result, formed is an insulating film consisting of the insulating film 14 formed in the central portion of each chip and the insulating film 16 formed in the peripheral portion of each chip.

Figure 5F:
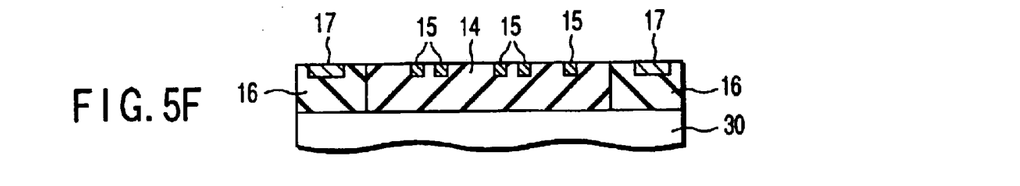

In the next step, a metal wiring 15 is formed in a surface region of the insulating film 14, and a bonding pad 17 is formed in a surface region of the insulating film 16, as shown in FIG. 5F.

The metal wiring 15 and the bonding pad 17 are formed as follows. Specifically, grooves for forming the metal wirings and the bonding pad are formed in the surface regions of the insulating film 14 and the insulating film 16, respectively, followed by successively forming, as required, a barrier metal layer made of TaN, Ta or WN and a Cu layer used as a seed by a sputtering method. Then, a Cu layer is formed by an electroplating method, followed by polishing the resultant Cu layer by a CMP method so as to planarize the Cu layer.

Figure 5G:
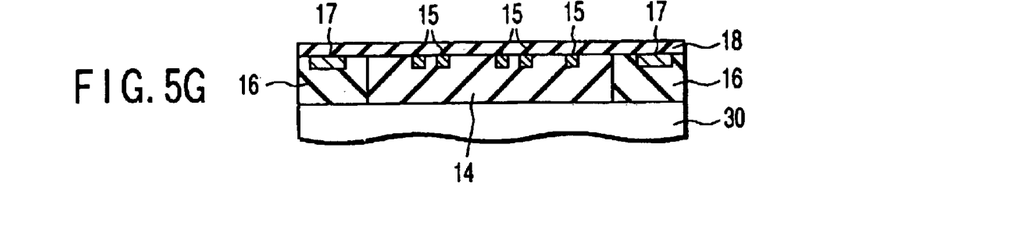

Finally, a stopper layer 18 made of, for example, SiN, SiCN or SiCO is formed on the entire surface, as shown in FIG. 5G.

A single wiring layer is formed by the series of the process steps described above, and a multi-layered wiring is formed by repeating the desired number of times the series of the process steps described above.

In the embodiment described above, a heat treatment is applied to an organic SOD film so as to bring about a crosslinking reaction and, thus, to form the porous insulating film 14 having a large number of pores. Alternatively, it is also possible to mix a resin having a high molecular weight in the SOD film and to apply a heat treatment to the SOD film. In this case, a foaming reaction, in which the resin having a high molecular weight is decomposed into substances having a low molecular weight such as $CH_4$, $CO_2$, $H_2$ and C by the heat energy in the heat treating step, is brought about within the SOD film so as to generate a large number of pores within the SOD film, thereby forming the porous insulating film 14.

Further, it is possible to use a polymer material in place of the SOD film noted above so as to form the insulating film 14. For example, it is possible to prepare a coating material by mixing a monomer ($C_xH_y$) having a high molecular weight, which originally has as porous structure, in a solvent, followed by baking the coated film so as to evaporate the solvent, thereby forming the insulating film 14 having pores of the molecule level.

It is also possible to prepare a coating material by mixing an organic resin having a high thermal stability and another organic resin having a low thermal stability. In this case, the organic resin having a low thermal stability is evaporated by the heat energy in the baking step so as to form the insulating film 14 having pores.

Further, it is also possible to prepare a coating material by mixing an inorganic phase of $SiO_2$ in a polymer material and to apply a heat treatment to the coated film. In this case, the coated film after the heat treatment is exposed to an HF atmosphere so as to permit elusion of $SiO_2$ alone, thereby forming the insulating film 14 having pores.

In the manufacturing method shown in FIGS. 5A to 5G, the organic SOD film 31 formed on the wafer 30 is subjected to a heat treatment for conversion into the insulating film 14, followed by selectively etching the insulating film 14 so as to permit the insulating film 14 to be left unremoved in the central portion alone of each chip.

Figure 6A:
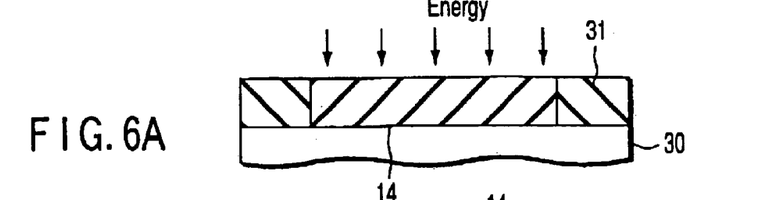
FIGS. 6A and 6B are cross sectional views successively showing other manufacturing steps of an LSI chip according to the first embodiment of the present invention.

In the manufacturing method according to a modification of the first embodiment, however, after formation of the organic SOD film 31 in the step shown in FIG. 5A, energy is selectively imparted to the central portion of each chip as shown in FIG. 6A. As a result, the central portion of each chip is heated to 350 to 400° C. so as to bake the particular portion of the organic SOD film 31, thereby forming the insulating film 14.

Figure 6B:
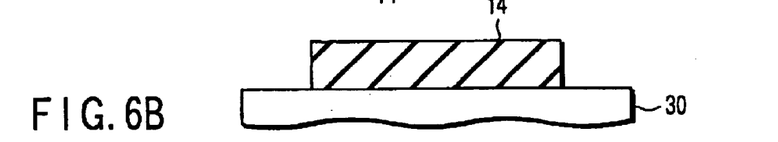

In the next step, that portion of the organic SOD film 31 to which energy was not imparted is dissolved in an organic solvent so as to be removed and, thus, the insulating film 14 is left unremoved in the central portion alone of each chip, as shown in FIG. 6B. The subsequent steps are equal to those shown in FIGS. 5D to 5G and, thus, the description thereof is omitted. Incidentally, the energy noted above can be imparted by, for example, the irradiation with a laser beam, the irradiation with an electron beam, or the irradiation with a molecular beam.

Figure 7A:
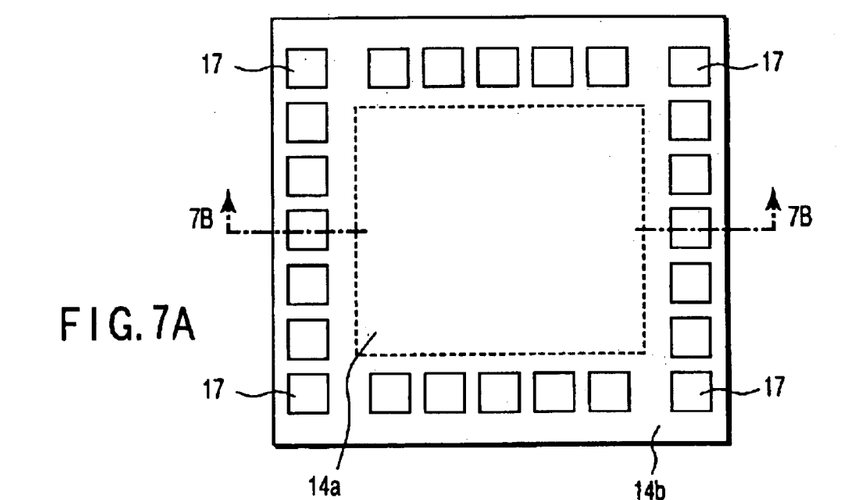
FIG. 7A is a plan view showing an LSI chip according to a second embodiment of the present invention.
Figure 7B:
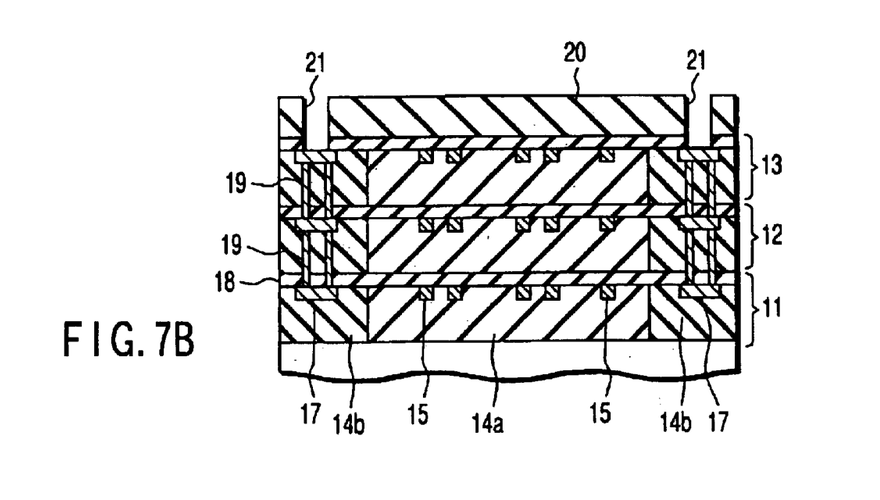
FIG. 7B is a cross sectional view along the line 7B—7B shown in FIG. 7A.

An LSI chip according to a second embodiment of the present invention will now be described with reference to FIGS. 7A and 7B. In FIGS. 7A and 7B, those portions which correspond to the portions shown in FIGS. 4A and 4B are denoted by the same reference numerals so as to avoid the overlapping description, and the description will be given to only those portions which differ from the portions of the LSI chip shown in FIGS. 4A and 4B.

The LSI chip shown in FIGS. 7A and 7B also has, for example, a three layer structure including the wiring layers 11, 12 and 13. Each of these three wiring layers 11, 12 and 13 is formed of a single kind of an insulating film, i.e., an organic SOD film, and includes a porous insulating film 14a formed in the central portion of the chip and a nonporous insulating film 14b formed in the peripheral portion of the chip.

The porous insulating film 14a, which has a low dielectric constant k of, for example, about 2.1, is low in its mechanical strength. On the other hand, the nonporous insulating film 14b, which has a high dielectric constant k of, for example, about 2.7, has a mechanical strength higher than that of the insulating film 14a.

The insulating film 14a having metal wirings 15 formed in a surface region is a porous insulating film having a low dielectric constant k of about 2.1. Since the dielectric constant k of the insulating film 14a is low, the degree of the capacitive coupling between the metal wirings 15 of the adjacent wiring layers is low so as to make it possible to suppress the value of the parasitic capacitance accompanying the metal wirings 15 to a small value. As a result, the delay time of the signal propagated through each of the metal wirings 15 can be improved so as to increase the operating speed of the LSI chip.

On the other hand, the insulating film 14b positioned around and below the bonding pad 17 in each of the wiring layers 11, 12 and 13 is a nonporous insulating film. The insulating film 14b is superior to the insulating film 14a in the mechanical strength. Therefore, the insulating film 14b is unlikely to be broken even if a mechanical impact is applied to the bonding pad 17 in the bonding step for bonding a wire to the bonding pad 17 in the uppermost wiring layer 13 or in the packaging step.

As described above, the operating speed of the LSI chip according to the second embodiment of the present invention can also be improved like the operating speed of the LSI chip shown in FIGS. 4A and 4B.

In the LSI chip shown in FIGS. 7A and 7B, the insulating film constituting each wiring layer is formed of two kinds of insulating films. Alternatively, it is possible for the insulating film constituting each wiring layer to be formed of three or more kinds of insulating films.

The LSI chip shown in FIGS. 7A and 7B can be manufactured by the manufacturing method described in the following with reference to FIGS. 8A to 8F.

Figure 8A:
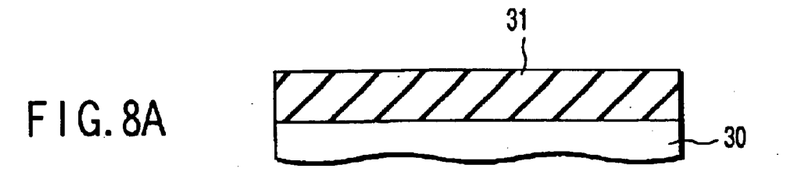
FIGS. 8A to 8F are cross sectional views successively showing the manufacturing steps of an LSI chip according to the second embodiment of the present invention.

In the first step, an organic SOD film 31 is formed on a wafer (substrate) 30 having elements and other wiring layers formed therein in advance by coating the surface of the wafer 30 with a coating material prepared by mixing an insulating film precursor including $SiO_2$ having an OH group attached thereto as a basic skeletal structure and a solvent, as shown in FIG. 8A. A spin coating method is employed for the coating.

Figure 8B:
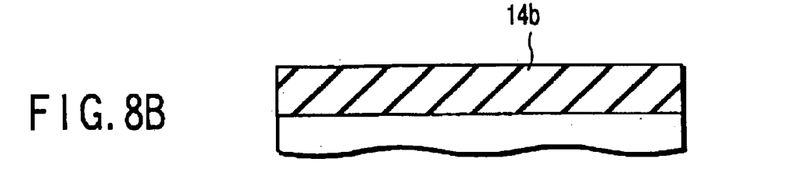

In the next step, a heat treatment is applied to the organic SOD film 31 under an oxygen gas atmosphere or a nitrogen gas atmosphere so as to bring about a crosslinking reaction over the entire region and, thus, to convert the organic SOD film 31 into an insulating film 14b, as shown in FIG. 8B. In this step, the insulating film 14b has a dielectric constant k of about 2.7.

Figure 8C:
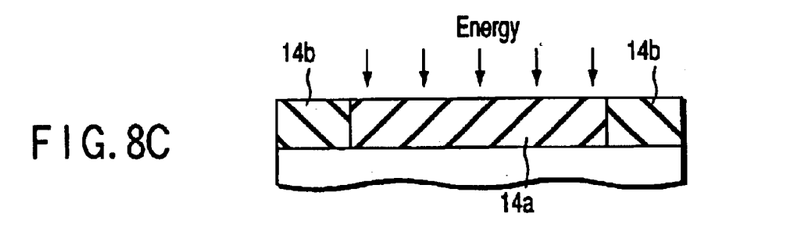

In the next step, energy is selectively imparted to the insulating film 14b in the central portion of each chip, as shown in FIG. 8C. Since the insulating film 14b is heated in this step at a temperature higher than the temperature in the previous baking step, the crosslinking reaction is promoted in the central portion of the chip, with the result that the insulating film 14b in the central portion of the chip is converted into a porous insulating film 14a having a large number of pores. Also, the nonporous insulating film 14b is left unchanged in the peripheral portion of the chip.

The energy noted above can be imparted by, for example, the irradiation with a laser beam, the irradiation with an electron beam or the irradiation with a molecular beam.

Figure 8D:
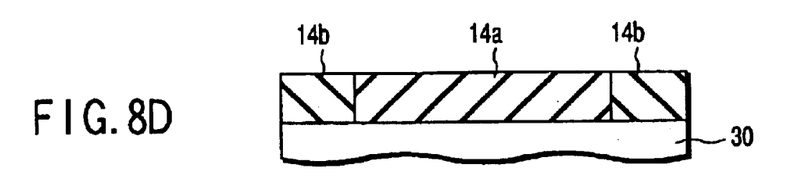

As a result, formed is an insulating film including the insulating film 14a formed in the central portion of the chip and the insulating film 14b formed in the peripheral portion of the chip, as shown in FIG. 8D.

Figure 8E:
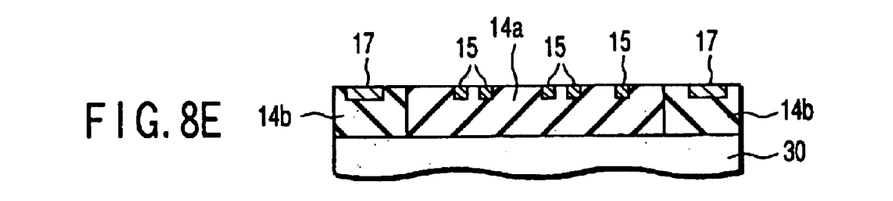
Figure 8F:
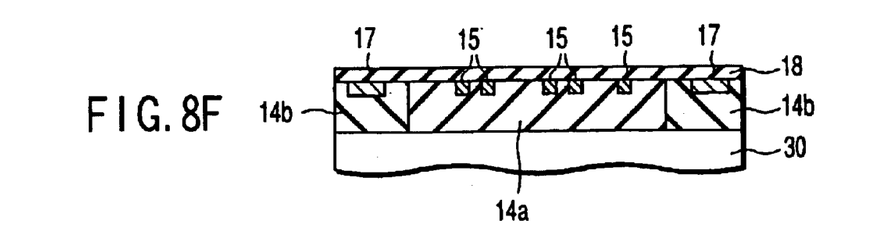

In the subsequent steps, the metal wirings 15 are formed in a surface region of the insulating film 14a and the bonding pad 17 is formed in a surface region of the insulating film 14b, as shown in FIGS. 8E and 8F, as in FIGS. 5F and 5G referred to previously.

In the second embodiment of the present invention described above, energy is selectively applied to the insulating film 14b in the central portion of each chip so as to promote a crosslinking reaction and, thus, to form the porous insulating film 14 having a large number of pores. Alternatively, it is also possible to mix a resin having a high molecular weight in the SOD film and to impart energy selectively to the SOD film. In this case, a foaming reaction, in which the resin having a high molecular weight is decomposed into substances having a low molecular weight such as $CH_4$, $CO_2$, $H_2$ and C by the imparted energy, is brought about within the SOD film so as to generate a large number of pores within the SOD film, thereby forming the porous insulating film 14a.

In the method shown in FIGS. 8A to 8F, energy is selectively imparted to the insulating film 14b by, for example, the irradiation with a laser beam, the irradiation with an electron beam, or the irradiation with a molecular beam so as to bring about a crosslinking reaction or a foaming reaction, thereby forming the porous insulating film 14a.

The porous insulating film 14a can be formed by another method. Specifically, after formation of the wirings in a surface region of the insulating film constituting the wiring layer, an alternating-current magnetic field is applied to the insulating film so as to generate an eddy current in the wiring and, thus, to increase the temperature of the wiring. As a result, heat is imparted to only that portion of the insulating film which is positioned in the vicinity of the wiring so as to selectively bring about a crosslinking reaction or a foaming reaction, thereby converting the particular portion of the insulating film into a porous insulating film.

Figure 9A:
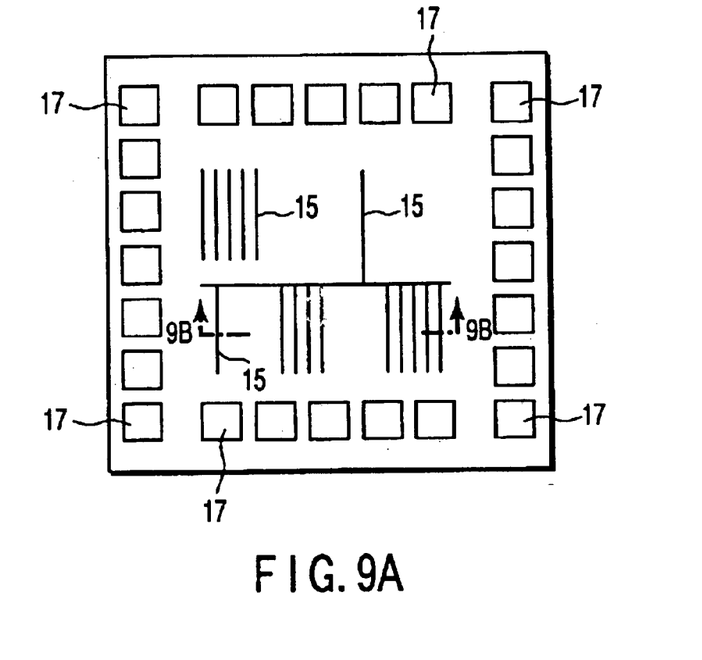
FIG. 9A is a plan view showing an LSI chip according to a third embodiment of the present invention.
Figure 9B:
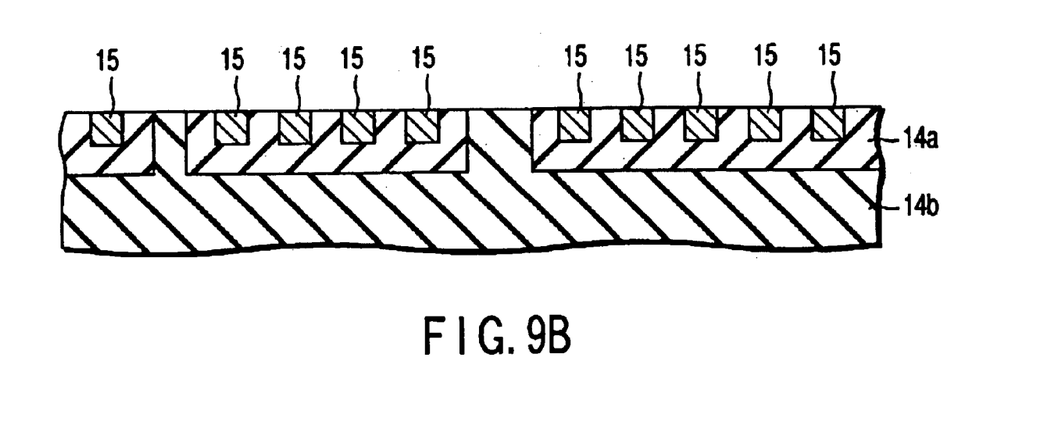
FIG. 9B is a cross sectional view along the line 9B—9B shown in FIG. 9A.

FIGS. 9A and 9B are a plan view and a cross sectional view, respectively, showing an LSI chip according to a third embodiment of the present invention, in which a porous insulating film is formed by applying an alternating-current magnetic field from the outside as described above. In FIGS. 9A and 9B, those portions which correspond to the portions shown in FIGS. 4A and 4B are denoted by the same reference numerals so as to avoid the overlapping description, and the description will be given to only those portions which differ from the portions of the LSI chip shown in FIGS. 4A and 4B.

As shown in FIGS. 9A and 9B, the metal wirings 15 are formed in a surface region of the nonporous insulating film 14b after the baking step. Then, an eddy current is generated by applying an alternating current-magnetic field from the outside so as to elevate the temperature around the metal wirings 15. As a result, heat is imparted to only that portion of the insulating film which is positioned in the vicinity of the metal wirings 15 so as to selectively bring about a crosslinking reaction or a foaming reaction, thereby forming the porous insulating film 14a.

Figure 10:
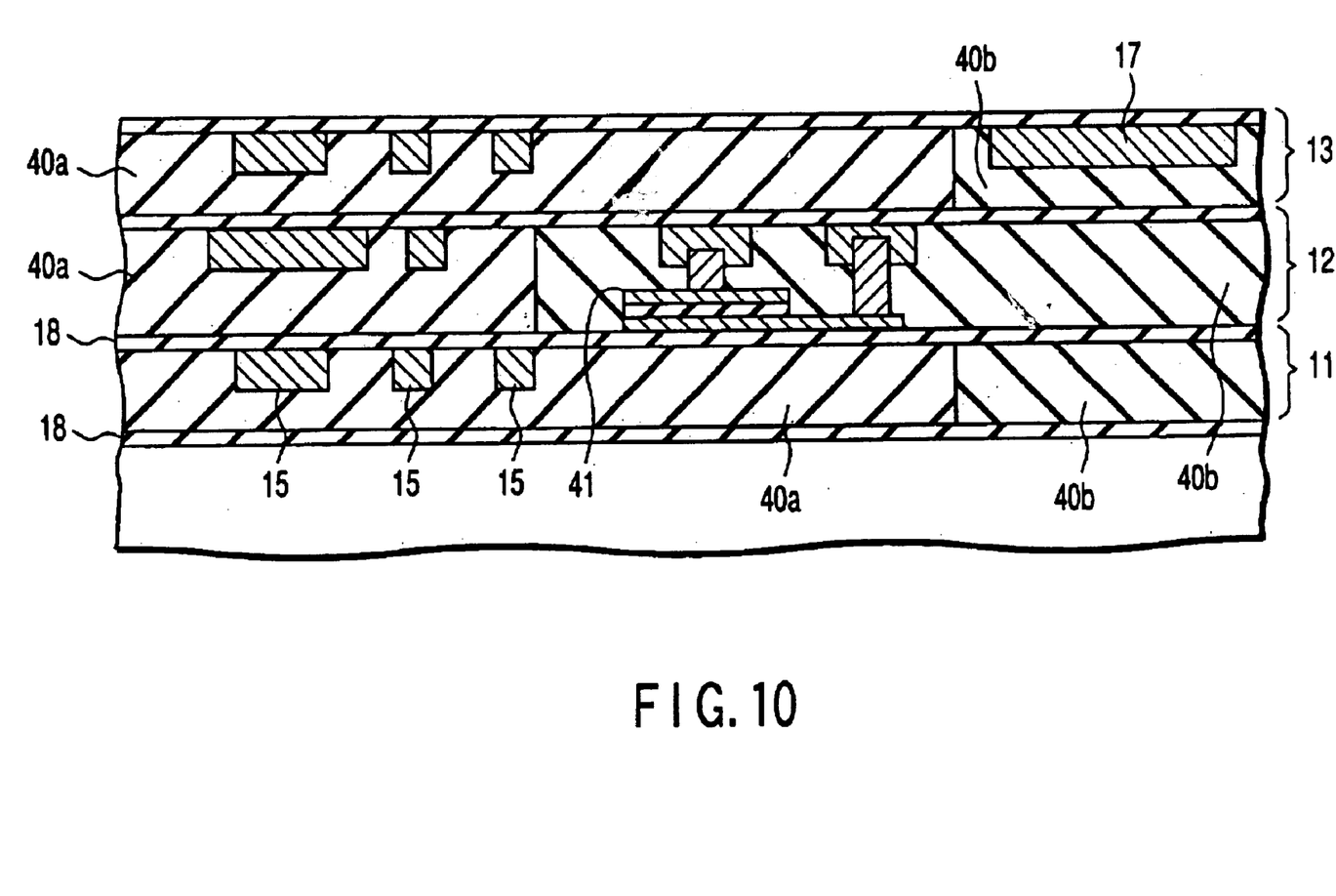
FIG. 10 is a plan view showing an LSI chip according to a fourth embodiment of the present invention.

FIG. 10 is a cross sectional view showing an LSI chip according to a third embodiment of the present invention. Incidentally, In FIG. 10, those portions which correspond to the portions shown in FIG. 4B are denoted by the same reference numerals so as to avoid the overlapping description, and the description will be given to only those portions which differ from the portions of the LSI chip shown in FIG. 4B.

As shown in FIG. 10, a plurality of wiring layers, e.g., three wiring layers 11, 12 and 13, are formed in the LSI chip. It should be noted that two different kinds of insulating films are formed in each of these three wiring layers 11, 12 and 13. To be more specific, a porous insulating film 40a made of an organic SOD film having a dielectric constant k of about 2.1 is formed in the region where the metal wirings 15 are formed in a surface region. On the other hand, an insulating film 40b made of aluminum oxide ($Al_2O_3$) is formed in the regions where the bonding pad 17 is formed in a surface region and where a MIM capacitor 41 is formed.

The MIM capacitor 41 comprises an upper electrode, a lower electrode, and a capacitor insulating film interposed between the upper electrode and the lower electrode. The capacitor insulating film is formed of, for example, SiN (silicon nitride), TaO (tantalum oxide), or TiN (titanium nitride).

The insulating film 40a having the metal wirings 15 formed in a surface region is a porous insulating film having a small dielectric constant k of about 2.1. Since the dielectric constant k of the insulating film 40a is low, the degree of the capacitive coupling between the metal wirings 15 of the adjacent wiring layers is low so as to make it possible to suppress the value of the parasitic capacitance accompanying the metal wirings 15 to a small value. As a result, the delay time of the signal propagated through each of the metal wirings 15 can be improved so as to increase the operating speed of the LSI chip.

On the other hand, the insulating film 40b made of $Al_2O_3$ and having the bonding pad 17 and the MIM capacitor 41 formed therein exhibits an excellent mechanical strength, and the amount of the hydrogen gas released when the insulating film 40b is heated is relatively small. It follows that the insulating film 40b is unlikely to be broken when a mechanical impact is applied to the bonding pad 17 in the bonding step for bonding a wire to the bonding pad 17 and in the packaging step.

As described above, the insulating film 40b made of $Al_2O_3$ is formed in the region where the MIM capacitor 41, etc. are formed. Therefore, in the heating step, the capacitor insulating film of the MIM capacitor is unlikely to be exposed to the hydrogen gas so as to prevent the deterioration in the performance of the MIM capacitor.

In the third embodiment described above, an insulating film, which releases a relatively small amount of a hydrogen gas when the insulating film is heated, is formed in the region where the MIM capacitor 41 is formed. However, in an LSI chip in which another element having a capacitor insulating film, e.g., a ferroelectric memory, is formed, the insulating film made of $Al_2O_3$ should be formed in the region where the ferroelectric memory is formed.

In the third embodiment described above, an insulating film made of $Al_2O_3$ is used as an insulating film that releases a hydrogen gas in a relatively small amount. Alternatively, it is also possible to use a $SiO_2$ film formed by, for example, a plasma CVD method as the insulating film 40b.

In the embodiment shown in FIG. 10, the insulating film constituting each of the wiring layer is formed of two different kinds of insulating films. However, it is also possible for the insulating film constituting each wiring layer to be formed of three or more different kinds of insulating films.

In each of the embodiments described above, the different kinds of the insulating films used for forming the same wiring layer are not limited to those described above. It is possible to use suitable insulating films depending on the characteristics of the regions within the LSI chip. For example, it is possible for the insulating film to be formed of a porous/nonporous organic SOD, MSQ (methylsilsesquioxane), HSQ (hydrogen-silsesquioxane), SiN, SION, SiCN, $SiO_2$, PSG, a polymer material-based porous MSX (methyl-poly-siloxane) and a porous PAE (polyarylene-ether).

Figure 11A:
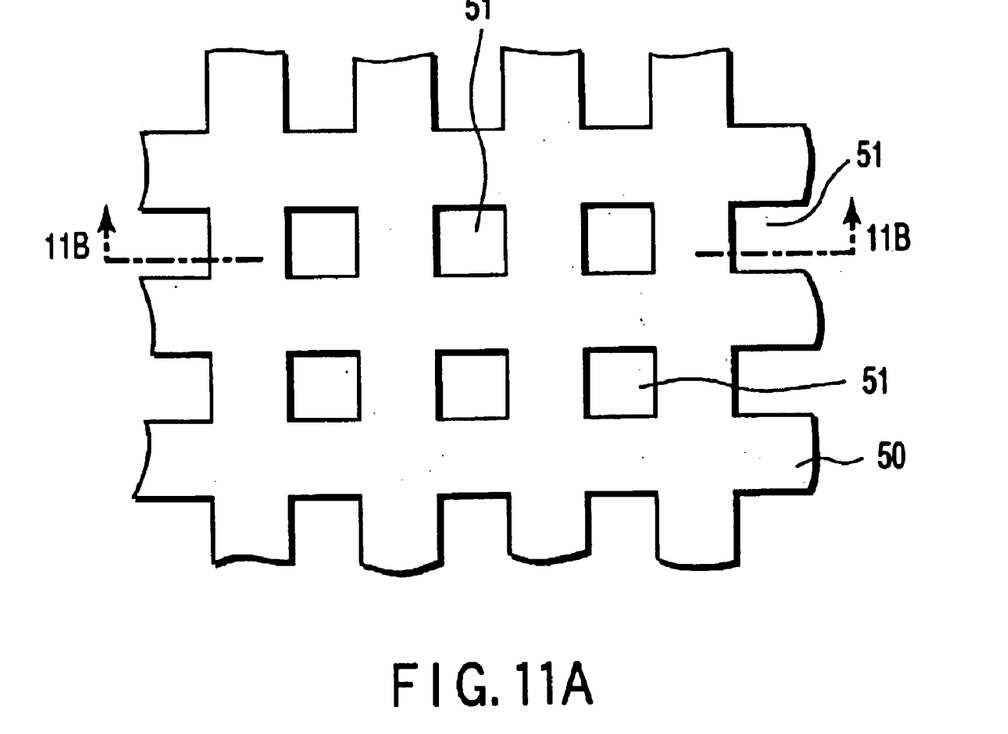
FIG. 11A is a plan view showing a wiring layer according to a modification of the present invention.
Figure 11B:
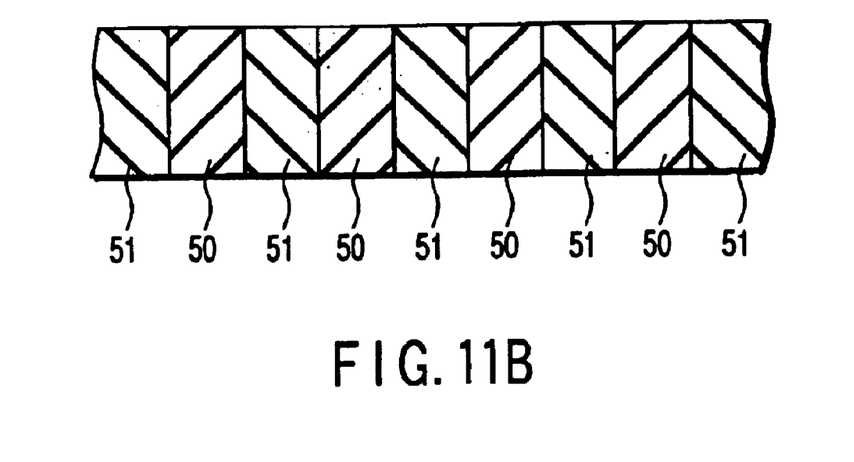
FIG. 11B is a cross sectional view along the line 11B—11B shown in FIG. 11A.

Also, in forming two different kinds of insulating films in each wiring layer, it is possible to arrange one insulating film 50 in a mesh-like arrangement and to arrange another insulating film 51 in an island-like arrangement, as shown in FIGS. 11A and 11B. It should be noted that the insulating film 50 corresponds to the insulating film 14 shown in FIGS. 4A and 4B, which is included in the LSI chip according to the first embodiment of the present invention. In other words, the insulating film 50 is porous and has a dielectric constant falling within a range of between 2.2 and 2.7. On the other hand, the insulating film 51 shown in FIGS. 11A and 11B corresponds to the insulating film 16 shown in FIGS. 4A and 4B and, thus, is excellent in its mechanical strength. Incidentally, it is also possible for the insulating films 50 and 51 shown in FIGS. 11A and 11B to correspond to the insulating films 16 and 14 shown in FIGS. 4A and 4B, respectively, which is opposite to that described above.

In each of the embodiments described above, the technical idea of the present invention is applied to an LSI chip including a bonding pad as an electrode to which a mechanical pressure is applied. Alternatively, it is also possible to apply the technical idea of the present invention to an LSI chip for BGA, in which a large number of ball electrodes are formed in the chip. To be more specific, a mechanical impact (mechanical pressure) is applied to the ball electrodes in the connecting step of the electrodes for mounting the LSI chip for BGA. Therefore, an insulating film having a high mechanical strength, e.g., a SiN film formed by a plasma CVD method, is formed in the region of the wiring layer where the ball electrodes are formed, and an insulating film having a low dielectric constant, e.g., an organic SOD film, is formed in that region of the wiring layer which does not require a high mechanical strength like the region where the metal wiring is formed.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device having a multi-wiring structure, comprising:
    coating a substrate with a film of an insulating material in which a crosslinking reaction or a foaming reaction is generated;
    subjecting the film of said insulating material to a heat treatment so as to bring about a crosslinking reaction or a foaming reaction, thereby forming a first insulating film on said substrate;
    selectively removing said first insulating film such that said first insulating film is selectively left unremoved on said substrate and is removed in the other region; and
    forming a second insulating film in the region where said first insulating film has been removed.

2. A method of manufacturing a semiconductor device having a multi-wiring structure, comprising:
    coating a substrate with a film of an insulating material in which a crosslinking reaction or a foaming reaction is generated;
    imparting energy to the film of said insulating material so as to selectively bring about a crosslinking reaction or a foaming reaction;
    removing the film of said insulating film in a region in which a crosslinking reaction or a foaming reaction has not taken place and leaving the film of said insulating material unremoved in a region in which a crosslinking reaction or a foaming reaction has taken place so as to form a first insulating film on said substrate; and
    forming a second insulating film in the region where the film of said insulating film has been removed.

3. The method of manufacturing a semiconductor device according to claim 2, wherein said energy is imparted to the film of said insulating material by means of irradiation with a laser light.

4. The method of manufacturing a semiconductor device according to claim 2, wherein said energy is imparted to the film of said insulating material by means of irradiation with an electron beam.

5. The method of manufacturing a semiconductor device according to claim 2, wherein said energy is imparted to the film of said insulating material by means of irradiation with a molecular beam.

6. The method of manufacturing a semiconductor device according to claim 2, wherein the film of said insulating material is an organic SOD film.

7. A method of manufacturing a semiconductor device having a multi-wiring structure, comprising:
    forming on a substrate an insulating film of an insulating material in which a crosslinking reaction or a foaming reaction is generated;
    selectively forming a wiring in a surface region of said insulating film; and
    applying an alternating-current magnetic field so as to generate an eddy current in said wiring, thereby heating said wiring so as to selectively bring about a crosslinking reaction or a foaming reaction in that region of said insulating film which is positioned in the vicinity of said wiring.

8. The method of manufacturing a semiconductor device according to claim 7, wherein said insulating film is an organic SOD film.

* * * * *